United States Patent [19]

Tracy

[11] 4,283,755
[45] Aug. 11, 1981

[54] MODULATOR MULTILAYER DETECTOR

[75] Inventor: John M. Tracy, Thousand Oaks, Calif.

[73] Assignee: The United States of America as represented by the Secretary of the Air Force, Washington, D.C.

[21] Appl. No.: 118,384

[22] Filed: Feb. 5, 1980

[51] Int. Cl.³ .............................................. H05K 1/14
[52] U.S. Cl. ................................... 361/393; 361/495; 361/413; 361/414
[58] Field of Search .............. 361/393, 395, 396, 414, 361/413

[56] References Cited

U.S. PATENT DOCUMENTS

| | | |
|---|---|---|
| 3,185,898 | 5/1965 | Ehlschalger ..................... 361/396 X |
| 3,330,995 | 7/1967 | Rayburn ............................. 361/395 |
| 3,418,533 | 12/1968 | Perotto ......................... 361/413 X |
| 3,555,364 | 1/1971 | Matcovich ..................... 361/414 X |
| 3,615,870 | 10/1971 | Crouthhamel .................. 361/393 X |
| 3,704,455 | 11/1972 | Scarborough ................. 340/173 SP |
| 3,705,332 | 12/1972 | Parks ................................. 174/68.5 |
| 3,777,221 | 12/1973 | Tatsuko .......................... 361/414 X |
| 4,200,900 | 4/1980 | McGeroge ...................... 361/413 X |

Primary Examiner—Richard R. Kucia
Attorney, Agent, or Firm—Joseph E. Rusz; Henry S. Miller

[57] ABSTRACT

Infrared detector arrays have focal plan processing in modular form mounted on stacked boards, where the processing integrated circuits are recessed in adjacent boards.

1 Claim, 3 Drawing Figures

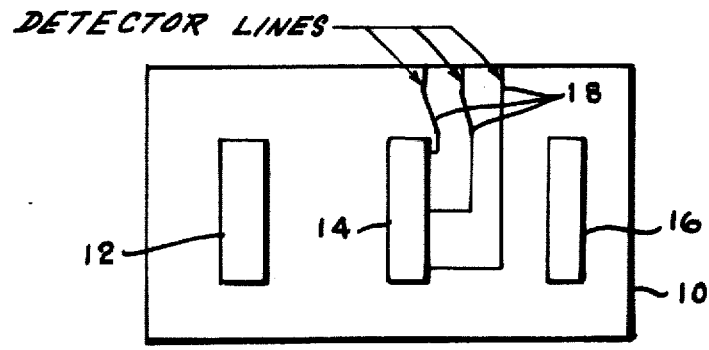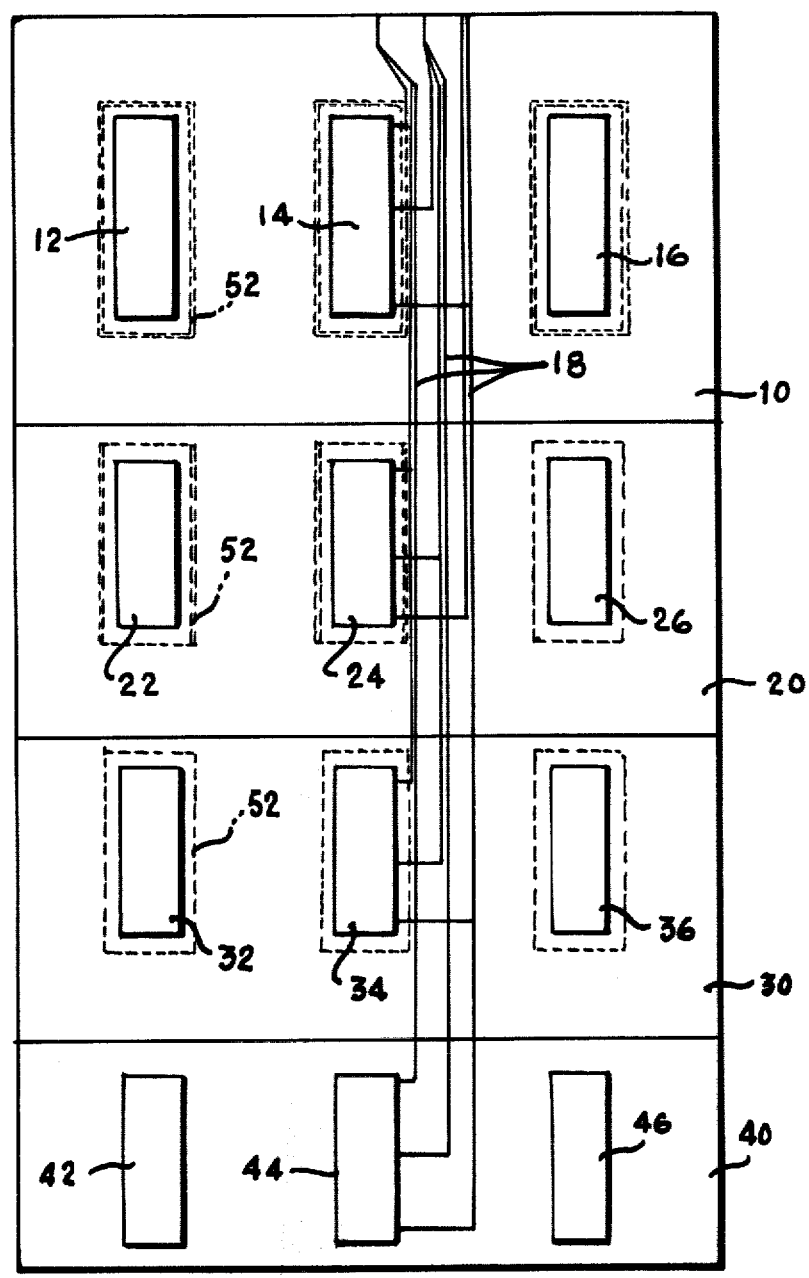

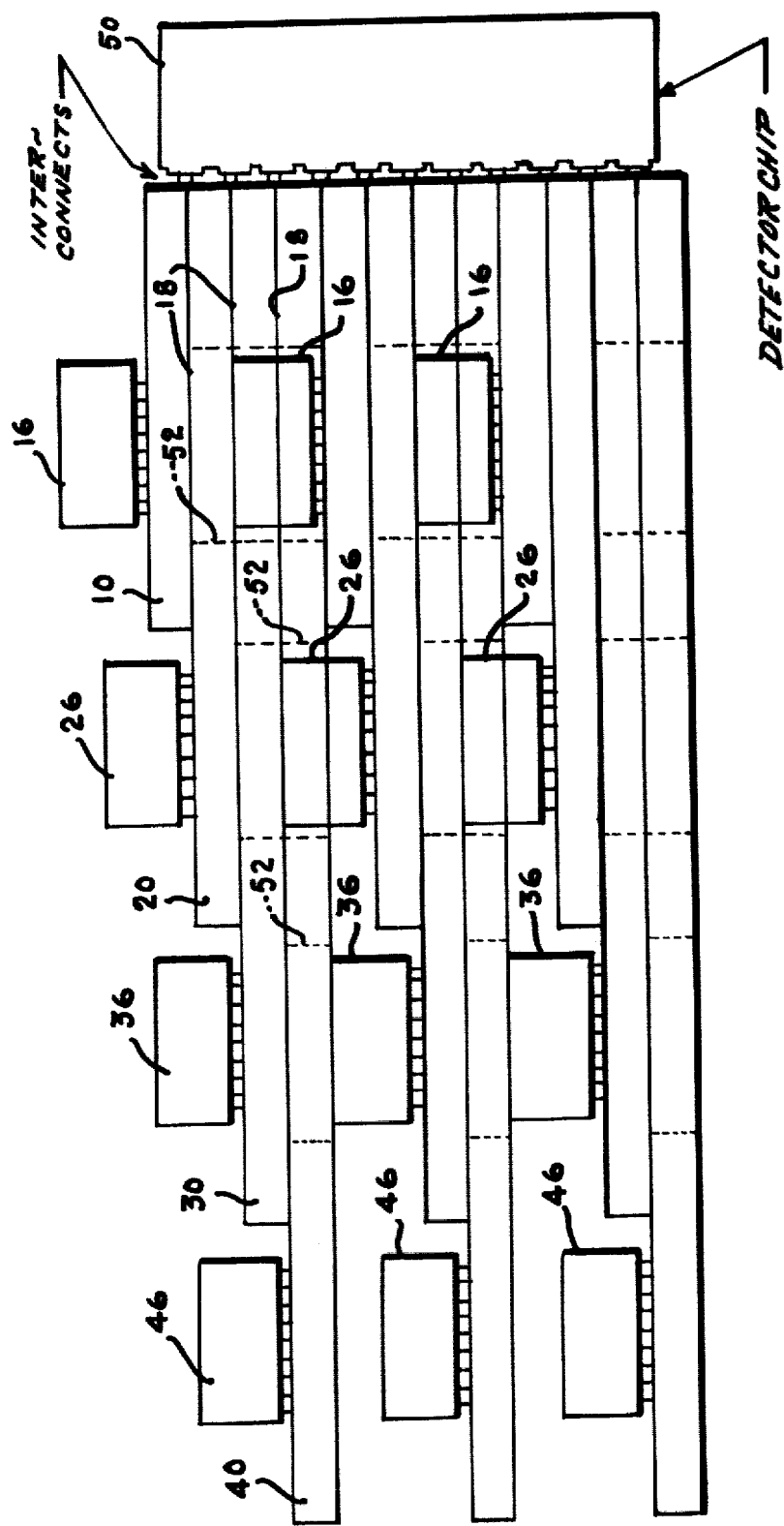

MODULATOR MULTILAYER DETECTOR

STATEMENT OF GOVERNMENT INTEREST

The invention described herein may be manufactured and used by or for the Government for governmental purposes without the payment of any royalty thereon.

BACKGROUND OF THE INVENTION

This invention relates generally to infrared detector arrays and more particularly to a modular multilayer detector interface for hybrid infrared focal planes.

Attempts to make hybrid infrared focal planes through the use of infrared detectors mated to the ends of multi-layer boards have resulted in many drawbacks. These multilayer boards consist of multiple layers of alternating metal and insulator material. The metal is in the form of numerous lines which connect individual detectors. The detectors from an array are joined to the ends of the lines which are exposed by cutting through all the layers in a plane. Since one layer of material is required for each row of detectors, many layers are required for any reasonably sized array. Hence a large area must be provided on the surface of individual layers for necessary signal processing circuitry, resulting in a large, expensive, fragile structure. Further, line lengths between the detector and its circuit become prohibitively long and yields of connected lines are reduced.

Multilayered large boards and their associated circuits are expensive to replace in that many functioning units will be discarded along with the malfunctioning circuit.

SUMMARY OF THE INVENTION

Using a modular approach for making connection to two dimensional infrared detector arrays, it is possible to place signal processing circuitry close to detectors thereby reducing the physical size of the boards and line lengths. Silicon integrated circuits are recessed into adjacent board modules which are mounted in a stacked fashion. The board material is more variable, and selected on the bases of thermal expansion match with the mated infrared detector materials.

Additionally, with the modular approach the yield of the final hybrid is increased since testing of electronics and the calibration of each detector for gain and offset is carried out on the modular level. The modular system allows focal planes of different sizes to be constructed with prefabricated modules.

The modular multilayer detector interface is formed of a plurality of submodules depending on application. Each sub module is formed of four layers with three integrated circuit processing chips per layer for a total of twelve chips per module. Each layer is three mils in thickness and each silicon processing chip has 128 inputs multiplexed to one line. Boards supporting the chip are recessed on the side away from the chip, as will be explained hereinafter, to receive a chip mounted on a board below in the stacked configuration. The ends of the stacked module boards contact the detector chip.

It is therefore an object of the invention to provide a new and improved modular multilayer detector interface for hybrid infrared focal planes.

It is another object of the invention to provide a modular multilayer detector interface which is easily maintained and low in maintenance cost.

It is a further object of the invention to provide a new and improved modular multilayer detector interface which is smaller in area than existing devices they replace.

It is still another object of the invention to provide a new and improved modulular multilayer of materials selected to match the thermal expansion qualities of mated infrared detectors.

It is still a further object of the invention to provide a modular multilayer detector interface which may utilize prefabricated processing modules.

It is another object of the invention to provide a new and improved means for making electrical connections to two-dimensional infrared detector arrays.

It is another object of the invention to provide a new and improved modular detector interface that utilizes stacked circuit boards.

These and other advantages, features and objects of the invention will become more apparent from the following description taken in connection with the illustrative embodiment in the accompanying drawing.

DESCRIPTION OF THE DRAWINGS

FIG. 1 is a top view showing the top view of one layer of the invention.

FIG. 2 is a top view showing the four layers of one submodule.

FIG. 3 is a side view in elevation of a submodule.

DESCRIPTION OF THE PREFERRED EMBODIMENT

Referring now to FIG. 1 there is shown a single top layer of a submodule of the invention. The board 10 is formed of a material thermally compatable with the infrared detector.

Three silicon chip processors 12, 14 and 16 are bonded by beam lead or flip-chip methods to board 10. Lines 18 leaving the integrated circuit lead to the detector and are formed for connecting purposes as shown. Each silicon processing chip has 128 inputs multiplexed into one line. This factor will vary based upon aplplication.

It should be understood that only one integrated circuit is being shown for purposes of explanation. However, processors 12 and 16 are identical in structure and design to chip 14.

FIG. 2 shows the four layers 10, 20, 30 and 40 of a complete submodule. As can be seen each layer contains three chips and hence each submodule contains twelve chips. Shown in phantom are the chips in recesses below the layers shown.

FIG. 3 is a side view of three submodules assembled to form a focal plane support structure. The top sub module is shown with chip processors 16, 26, 36 and 46 attached to boards 10, 20, 30 and 40.

The processors are connected via lines 18 to the detector chip 50. Dashed lines 52 represent apertures cut into layer material 10 through 40 to accommodate integrated circuits on the level below.

Each layer is of conventional material such as for example, epoxy glass or copper and approximately 3 mils in thickness. Processing chips are 0.006 inches in thickness.

In operation the entire structure must be cooled to detector operating temperature, therefore layer material thermal expansion will match detector thermal expansion.

An inherent advantage of the modular approach is in the electronic calibration where each detector has slightly different gain and offset the detector array is more easily adjusted.

Although the invention has been described with reference to a particular embodiment it will be understood to those skilled in the art that the invention is capable of a variety of alternative embodiments within the spirit and scope of the appended claims.

I claim:

1. A modular multilayer detector interface comprising: a plurality of stacked circuit boards including, a plurality of modular integrated circuits mounted thereon, wherein said boards are of variable length and in juxtaposition and said boards have a recessed area for receiving the integrated circuit mounted on the board abutting said board, and lead means extending from said integrated circuit to one end of said board for connection to a detector.